(12) United States Patent
Mitra et al.

(10) Patent No.: US 6,849,798 B2
(45) Date of Patent: Feb. 1, 2005

(54) PHOTOVOLTAIC CELL USING STABLE $CU_2O$ NANOCRYSTALS AND CONDUCTIVE POLYMERS

(75) Inventors: Chayan Mitra, Bangalore (IN); Danielle Walker Merfeld, Loudonville, NY (US); Gunasekaran Somasundaram, Kangalore (IN)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/321,181

(22) Filed: Dec. 17, 2002

(65) Prior Publication Data

US 2004/0256001 A1 Dec. 23, 2004

(51) Int. Cl.[7] ................. H01L 31/0264; H01L 31/0352
(52) U.S. Cl. ....................... 136/265; 136/252; 136/263; 257/43; 257/431; 257/466; 423/604
(58) Field of Search ................................ 136/265, 252, 136/263; 257/43, 431, 466; 423/604

(56) References Cited

U.S. PATENT DOCUMENTS 6,150,605 A * 11/2000 Han ........................... 136/263

2003/0127129 A1 * 7/2003 Yoshikawa et al. ......... 136/263

FOREIGN PATENT DOCUMENTS

| JP | 2002-100418 A | * | 4/2002 |
| JP | 2002-246624 A | * | 8/2002 |

OTHER PUBLICATIONS

Muramatsu et al, Journal of Colloid and Interface Science, 189, pp. 167–173 (1997).*

Ram et al, "Formation of stable Cu2O nanocrystals in a new orthorhombic crystal structure," Materials Science and Engineering A, vol. 304–306, pp. 805–809, May 2001.*

Wang et al, Adv. Mater., 14(1), pp. 67–69, Jan. 2002.*

Wang et al, Crystal Growth & Design, 3(5) pp. 717–720 (2003).*

* cited by examiner

Primary Examiner—Alan Diamond
(74) Attorney, Agent, or Firm—Fay, Sharpe, Fagan, Minnich & McKee, LLP

(57) ABSTRACT

The present invention relates to the use of a nanocrystalline layer of $Cu_2O$ in the construction of photovoltaic cells to increase the ability of the photovoltaic cells to utilize UV radiations for photocurrent generation.

27 Claims, 4 Drawing Sheets

A	B

PHOTOVOLTAIC CELL USING STABLE CU₂O NANOCRYSTALS AND CONDUCTIVE POLYMERS

BACKGROUND OF THE INVENTION

1. Field of the Invention

The present invention relates to the use of a nanocrystalline layer of $Cu_2O$ in the construction of photovoltaic cells to increase the ability of the photovoltaic cells to utilize UV radiations for photocurrent generation.

2. Discussion of the Art

The solar cell is considered a major candidate for obtaining energy from sun, since it can convert sunlight directly to electricity with high conversion efficiency, can provide nearly permanent power at low operating cost without having any influence on the climate. Recently, research and development of alternative energy technologies, specially, low cost, flat-panel solar cells, thin film devices, concentrator systems, and many innovative concepts have increased.

In a solar cell, the bandgap determines the conversion efficiency and the region of the solar spectrum (that is close to a black-body spectrum at temperature T=5800 K) it covers. According to the air-mass-zero (AMO) (assuming no absorption of radiation) spectra, the intensity is maximum around 400 to 600 nm. The primary requirement for a material to be applicable to solar cells is a bandgap matching the solar spectrum and high mobilities and lifetimes of charge carriers. Solar cells made of inorganic materials like Si, GaAs, CdTe, InP, etc., covers only a small fraction of the solar spectrum in the visible region (for example, the cut-off wavelength for GaAs and Si being 0.87 μm and 1.1 μm respectively). In a solar cell, for conversion efficiency, it is important to note that photons which have energy $\hbar\omega$ smaller than the semiconductor bandgap will not produce any electron—hole pairs. Also, photons with energy greater than the bandgap (Eg) will produce electrons and holes with same energy (Eg) regardless of how large ($\hbar\omega$–Eg) is. The excess energy $\hbar\omega$–Eg is simply dissipated as heat. Thus the solar cell efficiency depends quite critically on how the semiconductor bandgap matches with the solar energy spectra.

In an effort to increase the conversion efficiency of photovoltaic devices, thermo-photovoltaic (TPV) devices were developed, which converts thermal radiations (infrared radiations) to electricity. In this way, a substantial part of the solar spectrum was utilized for increasing the conversion efficiency and operating wavelength range. These devices are mostly heterojunction devices consisting of both wide and low bandgap materials. The energy gaps in these cases were varied from 0.3 to 0.7 eV, thereby covering long wavelength regions of the solar spectrum.

Major disadvantages with the TPV devices are that they are heterojunction devices requiring expensive epitaxial growth techniques for its fabrication. The necessity for epitaxial growth techniques arises from the fact that the materials require lattice matching between different materials involved in the structure.

The intensity of the solar spectrum is maximum in the Ultra-violet region. Presently, due to unavailability of proper lattice matched substrates for wide band gap semiconductors like GaN (Gallium Nitride), solar cells operating in the UV region of the solar spectrum is yet to be developed. The relation between the open-circuit voltage and the efficiency of a cell is given by the equation $$\eta = (I_{sc}V_{oc}FF/I_{incident}) \quad (1)$$

where, $I_{sc}$ is the short circuit current, $V_{oc}$ is the open-circuit voltage and FF is the fill factor. $I_{incident}$ is the intensity of the incident radiation. For AMO, $I_{incident}$ is 140 mW/cm² As can be seen from the equation, increase in intensity of the solar radiation increases the short circuit current of the cell. This in turn will lead to an increase in the efficiency of the cell. Use of lattice mismatched substrates results in existence of large defect densities, which in turn reduces the open-circuit voltage, and hence the efficiencies of the cell. It is quite well known that open-circuit voltage is limited by extrinsic recombination processes such as through bulk defect levels, through surface defect levels, and at metallic contacts to the cell.

When a monochromatic light of wavelength λ is absorbed in a solar cell, the photon flux in emitter, depletion region and base region will generate electron hole pairs which are accelerated by the junction electric field and collected in the front and back metal grids. Generation rate G(λ,x) of these carriers at a distance x from the front emitter surface is given by, $$G(\lambda,x) = \alpha_\lambda N_{ph}(\lambda)e^{-\alpha} \quad (2)$$

where $\alpha_\lambda$ is the absorption coefficient of the incident light in the solar cell material, $N_{ph}$ is the number of photon per unit area per second. Spectral response of a solar cell is given by the probability that the absorbed photon will yield a carrier for the photogenerated current of the cell. It might be good to account the feature that photocurrent, Jsc, of the cell for a given irradiance level E(λ) with its spectral distribution E(λ) dλ is given by, $$J_{sc} = qN_{ph}\int [1-R_\lambda]SR(\lambda)d\lambda \quad (3)$$

where $R_\lambda$ is the front surface reflectivity and SR is the spectral response of the cell. This indicates that the increase in intensity of the solar spectral radiation and the SR increases the short circuit current density ($J_{sc}$) of the cell. Hence, the key to improving the efficiency of the cell lies in increasing both the short-circuit current and open-circuit voltage of the cell.

Efficient dye-sensitized photovoltaic devices employing nanocrystalline metal oxide films were first reported in 1991, see B. O'Regan and M. Gratzel, Nature, 1991, 353, 737. Such cells can achieve solar to electrical energy conversion efficiencies of up to 10%. There is currently extensive commercial R&D aiming to develop photovoltaic devices based upon this design, centered around Prof. Gratzel's group in EPFL, Switzerland. Previous investigations have searched for the identity of the optimum sensitizer dye for this technology.

An important limitation in the design of dye-sensitized PV devices currently being commercialized is the requirement for an electrically conducting liquid component (an electrolyte). It has been proposed to replace this liquid with a solid-state eletrolyte analogue. The important requirements for such solid-state analogues are good device energy conversion efficiency, good stability and low sealing requirements. Gratzel and co-workers, have reporting that an organic material, OMeTAD developed for the Xerographic industry, is one such material, although the efficiency of the solid state device produced with this material was limited to <0.8%, see Back, et al., Nature 1998, 395, 583. Other proposals have considered conducting polymers but have to date achieved efficiencies even less than the above, see Murakosh, et al., Chem Letts., 1997, 471. Polymer gel electrolytes have also been shown to achieve high efficiencies, however such systems retain a solvent phase and therefore still require sealing, and cannot therefore be regarded as truly sold state. See Cao, et al., J. Phys. Chem, 1995, 99, 18071. There has been a report of the use of solid-state ionic commercial rubber, but efficiencies achieved were very low (0.1%), see Nogueira, et al., Abstracts IPS-12.

Various photovoltaic and battery cells are described in U.S. Pat. No. 5,441,827, U.S. Pat. No. 5,438,556, U.S. Pat. No. 4,520,086, International Publication No. WO 97/08719, and International Publication No. WO 93/20569.

Dye-sensitized solar cells are more and more maturing into a technically and economically credible alternative to the conventional p-n junction photovoltaics. Photoelectrochemical (PEC) liquid junction cells based on the photo-sensitization of semiconductor $TiO_2$ layers with molecular sensitizers attracted renewed interest after Gratzel, et al. reported energy conversion efficiencies >10%, in Nature, 353 (1991) 737. In 1998, Gratzel, et al. reported in Nature, 395 (1998) 583, a more innovative all solid-state cell based on a heterojunction sensitized by a molecular dye where an amorphous organic whole transport material replaced the liquid electrolyte.

The crucial part in these cells is the dye itself. Only a very limited number of dyes give high photocurrent quantum yields and are reasonably stable against photo-degradation. Some of the organic dyes exhibiting high light absorption are sensitive to air and water.

It is a well known phenomena that a semiconductor nanostructure exhibits a strong blue-shift (increase in the band gap energy) in the band gap due to quantum confinement effects. The band gap distribution is obtained by assuming a distribution of sizes for d (diameter of the nanostructures) and a relation governing the upshift in energy $\Delta E$ with the size d (due to quantum confinement). Considering, two possible distribution of sizes for the nanostructures, Gaussian and lognormal, given as $$P^G(d) = \frac{1}{\sqrt{(2\pi\sigma)}} \text{Exp}\left(-\frac{(d-d_O)^2}{2\sigma^2}\right)$$

where $d_O$ is the mean size and the $\sigma$ is the standard deviation, and $$P^L(d) = \frac{1}{\sigma_L d \sqrt{(2\pi)}} \text{Exp}\left[-\frac{(\ln(d)-m_O)^2}{2\sigma_L^2}\right]$$

where $m_O=\ln(d_O)$, and $\sigma_L=\ln(\sigma)$, respectively.

Thus the energy shift for the confinement $\Delta E$ can be written as $$\Delta E = E_G - E_g = C/d^t \quad (6)$$

where, $E_g$ is the crystalline fundamental band gap of the nanocrystals and $E_G$ is the increased band gap due to quantum confinement. The distribution of the band gaps of nanostructures $P(E_G)$ can be obtained by making a change of variable from d to EG in the distribution functions given in equations (4) and (5). This effect of energy shift to higher energy due to size quantization, with carriers being confined to essentially "zero" dimensional structure makes nanostructures a promising candidate for opto-electronic devices.

All nanostructures materials share three fundamental features of (i) atomic domains (crystalline core) spatially confined over 2 to 20 nm, (ii) significant atom fractions associated with interfacial environments, and (iii) interactions between their constituent domains. In so small particles, 60–20% of the total atoms form the surface of the particles (intercrystalline region). The fraction of the surface atoms ($\Phi$) is represented as a potential well with finite potential height ($V_O$) and the barrier representing the intercrystalline region. For finite barrier quantum structure, the binding energy ($E_b$) first increases when the cluster size is reduced. It reaches a maximum for a critical size of a cluster of a given material. Then the binding energy starts reducing once again even if the cluster size is reduced further. FIG. 1 shows a general configuration for a nanostructure.

Commercially available techniques for growth of quantum structures, like Molecular Beam Epitaxy (MBE) and Metal-Organic Chemical Vapor Deposition (MOCVD) are very expensive and require special handling capability. The modern inorganic photovoltaic technology uses some highly toxic materials such arsenic and phosphine compounds and specialized growth techniques for fabrication. Currently, most of the research focuses on low-cost photovoltaic devices using expensive thin film technology with TiO2 as the optical window coating for fabrication. But the efficiency of these cells is yet to cross the 10% threshold limit for domestic applications.

Mitra, et al. (Mat. Sci and Eng., A304–306 (2001) 805–809) has described the development of $Cu_2O$ nanostructures by $Cu^{2+} \rightarrow Cu \rightarrow Cu^+$ redox reaction in an aqueous medium by adding an aqueous $NaBH_4$ solution (a reducing agent) to an aqueous Cuprous Chloride ($CuCl_2$) solution at 80–100° C. As reported by Mitra, et al., the x-ray diffraction pattern represents an orthorhombic structure, which is significantly different from that of the well-known FCC structure of bulk $Cu_2O$. The ellipsoidal shape of $Cu_2O$ granules in the TEM micrograph shown in FIG. 2A is demonstrative of a modified morphology. The $Cu_2O$ nanocrystals exhibit a strong blue shift of the optical bandgap around 4.8 eV with respect to 2.1 eV in the bulk in the electronic absorption spectrum by a strong quantum confinement of the electronic charges. Using quantum structures, the entire UV part of the solar spectrum is used for improving the "short-circuit current" of the photovoltaic cell.

It is therefore a target of the present invention to propose photovoltaic cells having improved stability against photo-degradation and environmental influences. It is another target of the invention to achieve higher photocurrent quantum yields, higher photovoltages and hence higher conversion yields using the UV part of the solar spectrum.

BRIEF SUMMARY OF THE INVENTION

The present invention relates to an economical means of developing $Cu_2O$-polymer multilayers and usage of $Cu_2O$ nanocrystals for photovoltaic devices. The growth technique of the $Cu_2O$ nanostructures and its integration with conducting polymers enhances the collection efficiency for photovoltaic devices by enabling coverage of the entire UV and visible regions of the solar spectrum.

According to a first aspect of the invention substantially stable Cuprous Oxide ($Cu_2O$) nanocrystals of from about 5 to about 40 nm diameter synthesized using an ion exchange reaction $Cu^{2+} \rightarrow Cu \rightarrow Cu^+$ are used as an interlayer for polymeric photovoltaic (PV) applications. $Cu_2O$ nanocrystals exhibit a strong blue shift of the optical bandgap around 4.8 eV with respect to 2.1 eV in bulk. The size variation of the nanocrystals was obtained by controlling the reaction parameters such as pH (4–7), concentration of $Cu^{2+}$ cations in water (2 mol/liter to 8 mol/liter) and temperature (20° C. to 40° C.) of the reaction. This size qualtization modification of the bandgap and optical properties provides an important parameter for development of optical and electronic devices with superior optoelectronic properties. These separated nanocrystallites will be integrated with conducting polymers such as p-phenylenevinylenes, polyanilines and polythiophenes which appear to have a bandgap that lies in the range 1.5–3.0 eV, which makes them ideally suited for making optoelectronic devices. $Cu_2O$ nanocrystals, with bandgap around 4.8 eV and sandwiched between the polymer layers will greatly enhance the light collection efficiency thereby improving the "short-circuit current" of the PV devices.

These and other aspects and objections of the invention will become apparent upon reading and understanding of the detailed description of the invention.

BRIEF DESCRIPTION OF THE DRAWINGS

The invention may take form in various components and arrangements of components, and in various steps and arrangement of steps. The drawings, in which like reference numerals denote like components through the views, are only for purpose of illustrating particular embodiments and are not to be construed as limiting the invention.

DETAILED DESCRIPTION OF THE INVENTION

One embodiment of a solar photovoltaic cell according to the invention comprises a three-layered structure. The top layer of the proposed structure consists of a thin layer of poly (p-phenylene vinylene) (PPV) having a thickness of from about 0.1 to about 0.2 $\mu$m. The PPV has a low absorption coefficient in the UV region of the spectrum. PPV with its aromatic phenyl ring and conjugated vinylene linkage has a HOMO-LUMO ($\pi$-$\pi$*) energy gap of about 7.2 eV. This layer is mainly to protect the underlying nanocrystals from exposure to the contaminants and act as a window layer for UV absorption.

The second or the middle layer consists of $Cu_2O$ nanocrystals with a linear size distribution. This middle layer is further divided into three layers. The nanocrystals with smaller dimensions of from about 5 to about 10 nm in diameter and hence having a wider bandgap ($\approx$4.9 eV to 5.2 eV), will form the top layer. The middle layer consists of nanocrystals with dimensions of from about 10 to about 30 nm in diameter and bandgap $\approx$4.36 eV, and those with bigger size of from about 30 to about 40 nm in diameter and band gap of $\approx$4.0 eV will form the bottom layer. These nanocrystals have absorption coefficient of from about 0.8 to about 0.9 in the UV region. Hence, this size distribution in a graded manner as given in FIG. 3 of the proposed structure will facilitate in absorbing the entire UV region of the solar spectrum.

Figure 1:
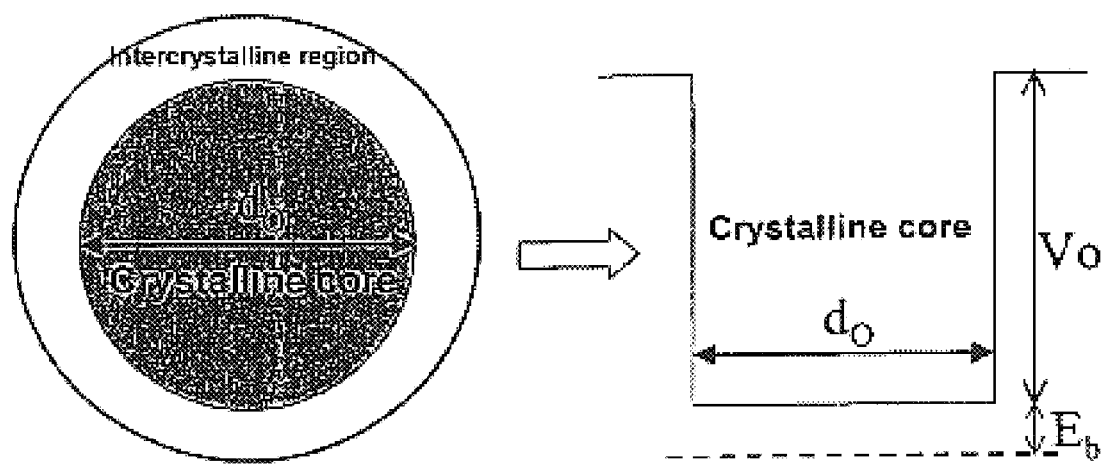
FIG. 1 depicts a general configuration of a nanostructures.
Figure 2:
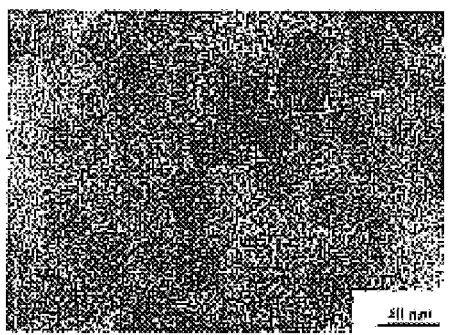
FIG. 2 depicts TEM micrograph and electron diffraction for $Cu_2O$ nanostructures formed from a redox reaction.
Figure 2:
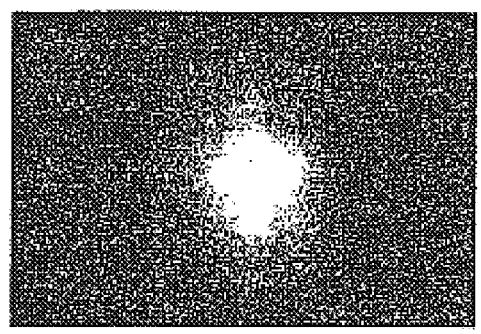
Figure 3:
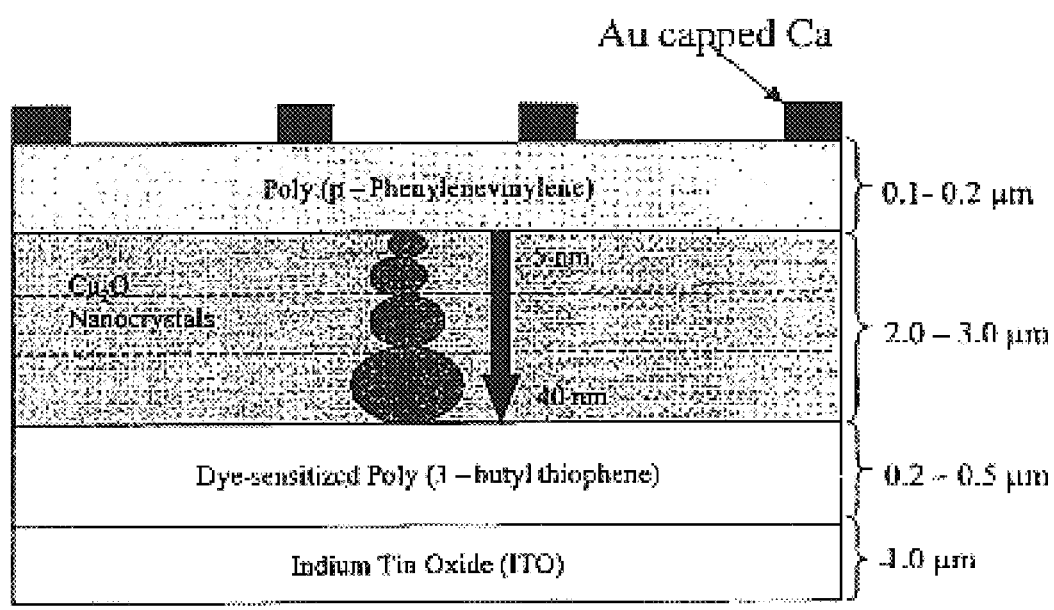
FIG. 3 depicts one embodiment of a solar photovoltaic device of the invention.

The third or the base layer consists of dye-sensitized poly (3-butyl thiophene) having a thickness of from about 0.2 to about 0.5 $\mu$m for absorption at 600 nm and higher wavelengths. It has a HOMO-LUMO ($\pi$-$\pi$*) energy gap of about 2.19 eV. The top contact consists of a grid pattern made of Gold (Au) capped Calcium (Ca) of about 5 $\mu$m in thickness to minimize the contact resistance of the top surface and the bottom contact consists of a layer of Indium Tin oxide (ITO) which is about 1.0 $\mu$m thick. ITO possesses a Fermi energy level taken to be approximately 4.5 to 5.0 eV relative to the vacuum state. It is a non-stoichiometric material and its electronic properties are strongly dependent on the preparation method employed. In fact, the surface microstructure of ITO is strongly dependent on the preparation method and can have a major impact on the device performance. Therefore, a small buffer layer may be needed to protect the active second and third layer from metal ion contamination and oxidation from the ITO anode. The schematic diagram of the proposed device is shown in FIG. 3.

Under open-circuit conditions, holes are collected at the high work function electrode ITO, and electrons are collected at the low work function Au capped Ca electrode. Using calcium front contacts and ITO back contacts open-circuit voltages >2 V can be obtained. Au capping was done to prevent oxidation of the Ca electrode.

The $Cu_2O$ is a non-stoichiometric reddish color compound. It is an important metal-oxide p-type semiconductor which has long been known to exhibit sharp excitonic structures in absorption and luminescence. It presents an ideal example of Bose-Einstin condensation of excitons and an anomalous response of photoconductivity at low temperatures.

The $Cu^{2+} \rightarrow Cu \rightarrow Cu^+$ ion exchange reaction was performed in an aqueous medium by adding an aqueous $NaBH_4$ solution (a reducing agent) drop by drop in a similar aqueous solution of $Cu^2$-cations ($CuCl_2$) at 80°–100° C. This is a highly vigorous exothermic reaction, in which $NaBH_4$ reduces the $Cu^2$+-cations into Cu atoms which simultaneously reoxidise to $Cu_2O$ in the aqueous medium at this temperature. The whole process occurs through a series of intermediate reactions with a continuous change in apparent color of the sample from a blue$\rightarrow$a green$\rightarrow$a deep green$\rightarrow$a white$\rightarrow$a white pink$\rightarrow$reddish black. The $Cu_2O$ particles are floating as slurries in the solution.

The $Cu_2O$ slurries slowly settle down in the beaker separating a clear solution over it. The solution contains NaCl, HCl and other dissolved by-products. The sample is filtered, repeatedly washed with fresh water, and finally boiled in distilled water at 100° C. in order to ensure that the by-product impurities are completely washed away. The recovered sample is dried in vacuum at 80–100° C. and that was found to be substantially stable in air. The sample is a finely divided loose powder. It does not pick up a significant amount of oxygen in air at room temperature.

The samples of selected crystallite sizes, in the range of 10–30 nm, could be synthesized by a proper adjustment of concentrations of the primary solutions between 0.1 and 1.0M and other experimental conditions. Several batches of a pure $Cu_2O$ sample were prepared in this way. An elemental analysis determined the Cu/O ratio ~2:1 according to its right chemical composition. No by-product impurities have been found in a detectable trace of 0.1 at. % or still lower.

Chemical phase analysis was carried out by x-ray powder diffractogram, which was recorded with the help of a P.W. 1710 x-ray diffractometer with a filtered Co K$\alpha$ source of radiation of wavelength $\lambda$=0.17902 nm. The microstructure (which includes size and morphology of crystallites/particles and their distribution in the powder) was studied with a JEM 2000cx transmission electron microscope. An average value of the crystallite size D was calculated from the bandwidths in the characteristic x-ray diffraction peaks under the Debye Scherrer approximation (which assumes the small crystallite size to be the only cause of the line broadening) after correcting for the instrumental broadening. The equivalent spherical diameter of the crystallites was calculated from the specific surface area measured by the Brunauer-Emmett-Teller (gas adsorption) technique using a Quantachrome Quanta sorb Jr. Instrument.

The symmetry of the $Cu_2O$ structure and its stability at smaller dimensions depends on the internal energy of the system. The lower the internal energy, the more stable the system will be. In fact, for a finite size particle, the surface energy has a very vital effect in determining the structure. The internal energy is a function of the crystal unit cell dimension, number of unit cells, the way these unit cells grow and its surface energy density. As a general rule, a nanostructure assumes a modified crystal structure in such a way that it presents a minimal total surface energy and a minimal value of its total Gibb's free energy (G).

TABLE 1

Comparative crystallographic parameters of $Cu_2O$ in nanostructures and bulk conditions

| Crystal properties | $Cu_2O$ (nano) | $Cu_2O$ (bulk) |
|---|---|---|
| Lattice parameter (nm) | a = 0.421 | a = 0.427 |
|  | b = 0.324 |  |
|  | c = 0.361 |  |
| Lattice surface area ($nm^2$) | 0.811 | 1.094 |
| Lattice volume ($nm^3$) | 0.049 | 0.078 |

Therefore, modifying the experimental parameters like, pH (4–7), temperature (20° C. to 40° C.), and the concentration of $Cu^{+2}$ cations in water (2 mol/liter to 8 mol/Lit), the size distribution of the nanostructures can be controlled. This inference was utilized in the solar cell structure having nanostructures with size distribution so as to cover a wide range of the UV region in the solar spectrum.

Figure 4:
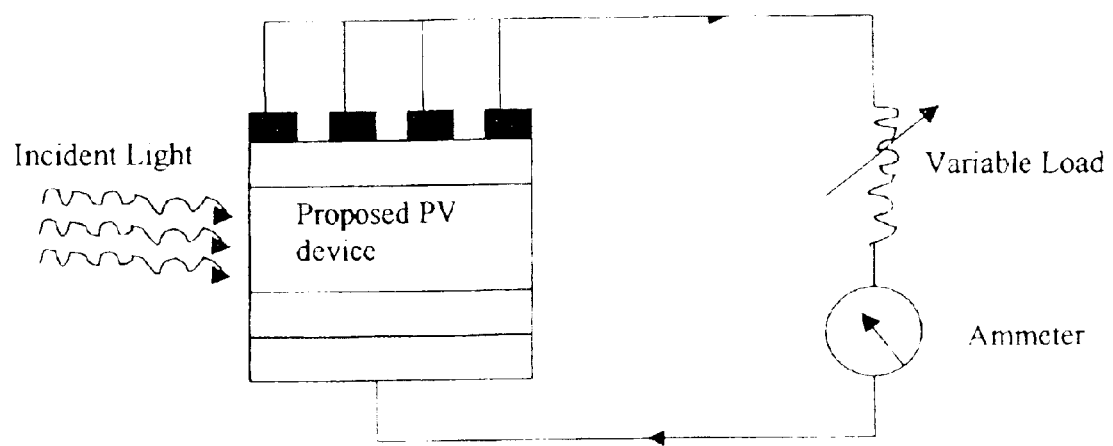
FIG. 4 depicts a solar cell according to the invention in a light energy conversion device.

The chemical process provides an efficient and economical means of producing $Cu_2O$ nanoparticles. As the nanoparticles have a very high bandgap (in the UV region) the UV radiations of the solar spectrum is sued for photocurrent generation. Using dye-sensitized poly (3-butyltriophene) helps in the absorption of visible solar spectrum at 600 nm and higher wavelengths. This invention is particularly useful for fabrication of a low-cost and high-efficiency solar cells using nanostructures. An example of such a solar cell is shown in FIG. 4.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification. It is contemplated that such modifications and alternatives are within the scope of this invention as subsequently claimed herein.

What is claimed is:

1. A photovoltaic (PV) cell comprising a layer of nanocrystalline material, wherein the layer of nanocrystalline material contains $Cu_2O$ nanoparticles and the $Cu_2O$ nanoparticles have a graded linear size distribution.

2. The photovoltaic cell of claim 1 wherein the layer of nanocrystalline material has three layers comprising a top layer, a middle layer, and a bottom layer.

3. The photovoltaic cell of claim 2 wherein the top layer has $Cu_2O$ particles having sizes which are smaller than the middle layer.

4. The photovoltaic cell of claim 2 wherein the middle layer has $Cu_2O$ having sizes which are smaller than the bottom layer.

5. The photovoltaic cell of claim 2 wherein the top layer has $Cu_2O$ particles having sizes ranging from about 5 to about 10 nm in diameter.

6. The photovoltaic cell of claim 2 wherein the middle layer has $Cu_2O$ particles having sizes ranging from about 10 to about 30 nm in diameter.

7. The photovoltaic cell of claim 2 wherein the bottom layer has $Cu_2O$ particles having sizes ranging from about 30 to about 40 nm in diameter.

8. The photovoltaic cell of claim 1 wherein the $Cu_2O$ nanoparticles have an ellipsoidal shape.

9. The photovoltaic cell of claim 1, wherein the $Cu_2O$ nanoparticles have an absorption coefficient which is in the UV region of the solar spectrum, and the photovoltaic cell further comprises a semiconductor material having an absorption coefficient in the visible light region of the solar spectrum.

10. A photovoltaic cell comprising a top contact layer, a protective layer attached to and immediately below the top contact layer, a nanocrystalline layer attached to and immediately below the protective layer, a semiconducting layer attached to and immediately below the nanocrystalline layer and a bottom contact layer attached to and immediately below the semiconducting layer, wherein the nanocrystalline layer is formed from $Cu_2O$ nanoparticles.

11. The photovoltaic cell of claim 10 wherein the layer of nanocrystalline material has a graded linear size distribution of $Cu_2O$ nanoparticles.

12. The photovoltaic cell of claim 11 wherein the layer of nanocrystalline material has three layers comprising a top layer, a middle layer, and a bottom layer.

13. The photovoltaic cell of claim 12 wherein the top layer has $Cu_2O$ particles having sizes which are smaller than the middle layer below it.

14. The photovoltaic cell of claim 12 wherein the middle layer has $Cu_2O$ having sizes which are smaller than the bottom layer below it.

15. The photovoltaic cell of claim 12 wherein the top layer has $Cu_2O$ particles having sizes ranging from about 5 to about 10 nm in diameter.

16. The photovoltaic cell of claim 12 wherein the middle layer has $Cu_2O$ particles having sizes ranging from about 10 to about 30 nm in diameter.

17. The photovoltaic cell of claim 12 wherein the bottom layer has $Cu_2O$ particles having sizes ranging from about 30 to about 40 nm in diameter.

18. The photovoltaic cell of claim 10 wherein the $Cu_2O$ nanoparticles have an ellipsoidal shape.

19. The photovoltaic cell of claim 10 wherein the top contact layer comprises a grid pattern of calcium capped with gold.

20. The photovoltaic cell of claim 19 wherein the top contact layer is about 5 µm thick.

21. The photovoltaic cell of claim 10 wherein the protective layer is comprised of poly(phenylvinylene).

22. The photovoltaic cell of claim 21 wherein the protective layer is about 0.1 to about 0.2 µm thick.

23. The photovoltaic cell of claim 10 wherein the semiconducting layer is constructed of a material selected from poly(p-phenylenevinylenes), polyanilines and polythiophenes.

24. The photovoltaic cell of claim 10 wherein the semiconducting layer is poly(3-butylthiophene).

25. The photovoltaic cell of claim 24 wherein the semiconducting layer is about 0.2 to about 0.5 µm thick.

26. The photovoltaic cell of claim 10 wherein the bottom contact layer is constructed from indium tin oxide (ITO).

27. The photovoltaic cell of claim 26 wherein the bottom contact layer is about 1.0 µm thick.

* * * * *